US009692295B2

(12) United States Patent
Takemoto et al.

(10) Patent No.: US 9,692,295 B2
(45) Date of Patent: Jun. 27, 2017

(54) POWER CONVERTER INCLUDING A POWER CONVERTER CIRCUIT AND A PLURALITY OF CAPACITORS FOR REDUCTION OF NOISE CURRENTS

(71) Applicants: DENSO CORPORATION, Kariya, Aichi-pref. (JP); NIPPON SOKEN, INC., Nishio, Aichi-pref. (JP)

(72) Inventors: Yuuki Takemoto, Kariya (JP); Shinji Ohoka, Okazaki (JP)

(73) Assignees: DENSO CORPORATION, Kariya (JP); NIPPON SOKEN, INC., Nishio (JP)

( * ) Notice: Subject to any disclaimer, the term of this patent is extended or adjusted under 35 U.S.C. 154(b) by 242 days.

(21) Appl. No.: 14/573,252

(22) Filed: Dec. 17, 2014

(65) Prior Publication Data

US 2015/0171736 A1    Jun. 18, 2015

(30) Foreign Application Priority Data

Dec. 17, 2013 (JP) .................................. 2013-259810

(51) Int. Cl.
| | |
|---|---|
| H02M 1/44 | (2007.01) |
| H01F 27/28 | (2006.01) |
| H05K 7/14 | (2006.01) |
| H05K 9/00 | (2006.01) |
| H02M 7/00 | (2006.01) |
| H02M 1/14 | (2006.01) |
| H02M 3/335 | (2006.01) |

(52) U.S. Cl.
CPC .............. *H02M 1/44* (2013.01); *H01F 27/28* (2013.01); *H05K 7/1432* (2013.01); *H05K 9/0075* (2013.01); *H02M 1/14* (2013.01); *H02M 3/33553* (2013.01); *H02M 7/003* (2013.01)

(58) Field of Classification Search
CPC .......... H02M 1/44; H02M 1/146; H02M 1/14; H02M 1/143; H02M 3/33523; H02M 7/0003
See application file for complete search history.

(56) References Cited

U.S. PATENT DOCUMENTS 9,270,195 B2 * 2/2016 Fujino ................... H02M 7/003
9,300,221 B2 * 3/2016 Asako ................... H02M 7/003
(Continued)

FOREIGN PATENT DOCUMENTS

| JP | 2012-135175 | 7/2012 |
| JP | 2014-187860 | 10/2014 |

*Primary Examiner* — Jue Zhang
*Assistant Examiner* — Lakaisha Jackson
(74) *Attorney, Agent, or Firm* — Nixon & Vanderhye PC

(57) ABSTRACT

In a power converter, an external terminal, a case, and capacitors are arranged to provide a conductive loop. The conductive loop defines thereinside a first region through which magnetic flux of an AC magnetic field penetrates, and a second region through which the magnetic flux penetrates. A magnetic-flux shielding member partly shields at least one of the first region and the second region from penetration of the magnetic flux of the AC magnetic field to adjust at least one of an amount of the magnetic flux penetrating through one of the first region and the second region, and an amount of the magnetic flux penetrating through the other thereof.

9 Claims, 12 Drawing Sheets

(56) References Cited

U.S. PATENT DOCUMENTS

| | | | |
|---|---|---|---|
| 2008/0180207 A1* | 7/2008 | Park | H01F 27/365 336/84 R |
| 2012/0119723 A1* | 5/2012 | Mizutani | H02M 3/158 323/311 |
| 2012/0161900 A1 | 6/2012 | Sakoda et al. | |
| 2013/0100634 A1* | 4/2013 | Okubo | H01F 27/36 361/816 |
| 2014/0233281 A1* | 8/2014 | Goto | H02M 7/003 363/39 |
| 2015/0171736 A1* | 6/2015 | Takemoto | H02M 1/44 363/17 |

* cited by examiner

POWER CONVERTER INCLUDING A POWER CONVERTER CIRCUIT AND A PLURALITY OF CAPACITORS FOR REDUCTION OF NOISE CURRENTS

CROSS REFERENCE TO RELATED APPLICATIONS

This application is based on and claims the benefit of priority from Japanese Patent Application 2013-259810 filed on Dec. 17, 2013, the disclosure of which is incorporated in its entirety herein by reference.

TECHNICAL FIELD

The present disclosure relates to power converters having a power converter circuit and a plurality of capacitors for reduction of noise currents.

BACKGROUND

There are known power converters for converting a DC voltage to an AC voltage, transforming the magnitude of the AC voltage to another magnitude, and rectifying the transformed AC voltage to generate a DC voltage, thus stepping up or down the input DC voltage. These power converters include one type of power converters equipped with a filter circuit for removing noise, which is disclosed in Japanese Patent Application Publication No. 2012-135175. In the power converter, that is, a DC to DC converter, disclosed in the Patent Publication, the power converter is installed in a case, and the filter circuit is installed in the case of the power converter. The filter circuit is electrically connected to external terminals, such as an input terminal and an output terminal, of the DC to DC converter.

The filter circuit is operative to remove noise currents, which try to enter from external devices into the DC to DC converter, and remove noise currents generated in the DC to DC converter, which may interfere with external devices.

The filter circuit is comprised of a capacitor, a coil, and wires connecting the capacitor and the coil.

SUMMARY

However, noise currents may result from the capacitor and/or the wires constituting the filter circuit. That is, as described above, because the DC to DC converter converts an input DC voltage into an AC voltage, there are components in the DC to DC converter in which an AC current flows, resulting in an AC magnetic field around the AC current. An interlinkage of the AC magnetic field with the wires and the like may induce noise currents, and the induced noise currents may be transferred to external devices externally via the external terminals, resulting in adverse effects on the external devices. Thus, it is desired to provide a power converter device, even if an AC magnetic field is generated in the power converter device, which is capable of limiting transmission of large-magnitude noise currents induced based on the AC magnetic field to the external terminals of the power converter.

In view of the circumstances set forth above, one aspect of the present disclosure seeks to provide power converters, which are capable of achieving the desire set forth above.

Specifically, an alternative aspect of the present disclosure aims to provide such power converters, each of which is capable of, even if an AC magnetic field is generated in the power converter, limiting entrance of large-magnitude noise currents based on the AC magnetic field an external terminal of the power converter.

According to an exemplary aspect of the present disclosure, there is provided a power converter. The power converter includes a power converter circuit having a portion that generates an AC magnetic field having a magnetic flux. The power converter is configured to perform power conversion of input power into output power. The power converter includes a case that is grounded. At least part of the power converter circuit is installed in the case. The power converter includes an external terminal electrically connected to the power converter circuit for connection of an external device to the power converter circuit. The power converter includes a plurality of capacitors located electrically connected to the external terminal and to the case. The external terminal, the case, and the plurality of capacitors are arranged to provide a conductive loop. The conductive loop defines thereinside: a first region through which the magnetic flux of the AC magnetic field penetrates from one of a first side and a second side of the conductive loop to the other of the first side and the second side of the conductive loop; and a second region through which the magnetic flux of the AC magnetic field penetrates from the other of the first side and the second side to the one of the first side and the second side of the conductive loop. The first side is a near side of the conductive loop closer to the portion of the power converter circuit, and the second side is a far side of the conductive loop far from the portion of the power converter circuit. The power converter includes a magnetic-flux shielding member. The magnetic-flux shielding member is configured to partly shield at least one of the first region and the second region from penetration of the magnetic flux of the AC magnetic field to adjust at least one of an amount of the magnetic flux penetrating through one of the first region and the second region, and an amount of the magnetic flux penetrating through the other thereof.

In the exemplary aspect of the present disclosure, the magnetic flux penetrates through one of the first region and the second region from one of the first side and the second side of the conductive loop to the other of the first side and the second side of the conductive loop, and penetrates through the other of the first region and the second region from the other of the first side and the second side of the conductive loop to the one of the first side and the second side of the conductive loop. The penetration of the magnetic flux through the first region induces a first inductive noise current flowing through the conductive loop, and the penetration of the magnetic flux through the second region induces a second inductive noise current flowing through the conductive loop. Because the direction of the magnetic flux penetrating through the first region is opposite to the direction of the magnetic flux penetrating through the second region, the first noise current flowing through the conductive loop is opposite in direction from the second noise current flowing through the conductive loop.

Because the first noise current and the second noise current flow through the conductive loop in the opposite directions to each other, they cancel each other so as to be weakened. This prevents large-magnitude noise currents from entering the external terminal.

Particularly, in the exemplary aspect of the present disclosure, even if there is a difference between the amount of the magnetic flux penetrating through the first region and the amount of the magnetic flux penetrating through the second region, the magnetic-flux shielding member is provided. The magnetic-flux shielding member partly shields at least one of the first region and the second region from penetration of the magnetic flux of the AC magnetic field to adjust an amount of the magnetic flux penetrating through one of the first region and the second region and an amount of the magnetic flux penetrating through the other thereof. This makes it possible to reduce the difference between the amount of the magnetic flux penetrating through one of the first region and the second region and the amount of the magnetic flux penetrating through the other thereof. This results in that the magnetic flux passing through the first region being substantially equal to the magnetic flux passing through the second region. This results in the magnitude of the first inductive noise current being substantially equal to that of the second inductive noise current, thus efficiently reducing entrance of noise currents into the external terminal.

Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Embodiments of the present disclosure will be described hereinafter with reference to the accompanying drawings.

Power converters according to the embodiments can serves as power converters installable in vehicles, such as electric vehicles and hybrid vehicles.

First Embodiment

A power converter 1 according to the first embodiment will be described hereinafter with reference to FIGS. 1 to 10.

Figure 1:
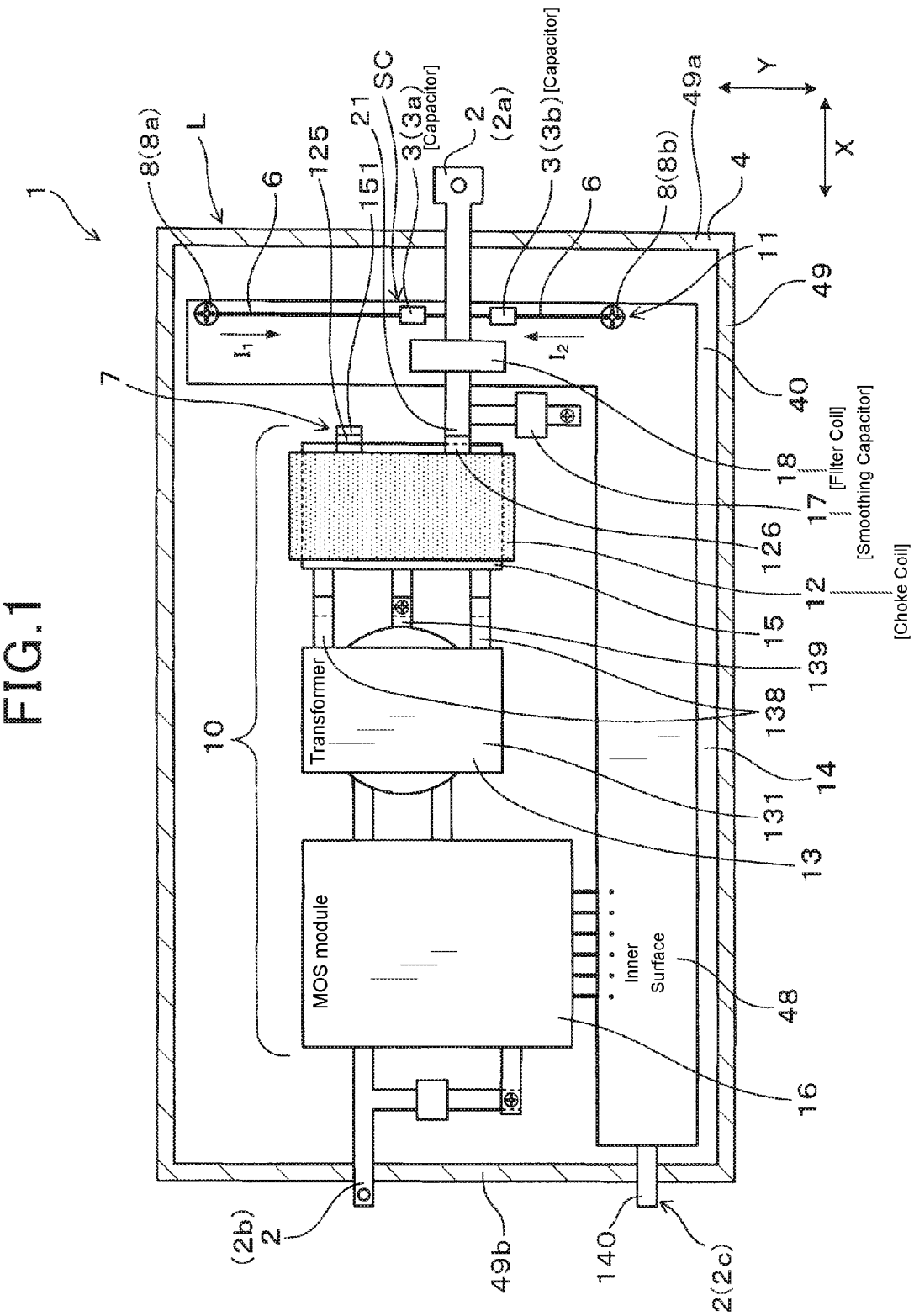
FIG. 1 is a plan view of a power converter according to a first embodiment of the present disclosure.
Figure 2:
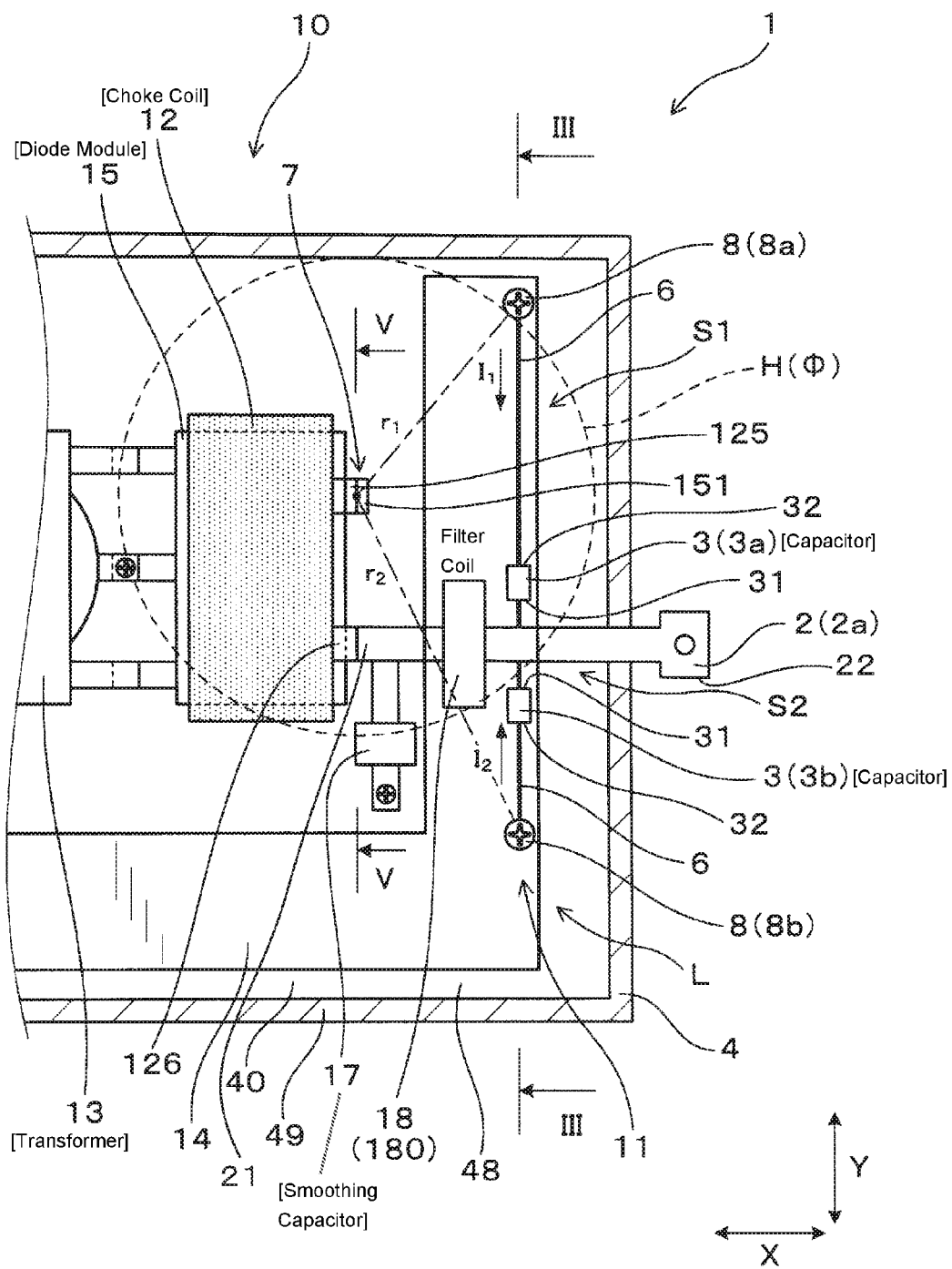
FIG. 2 is an enlarged view schematically illustrating an important part of the power converter illustrated in FIG. 1.
Figure 3:
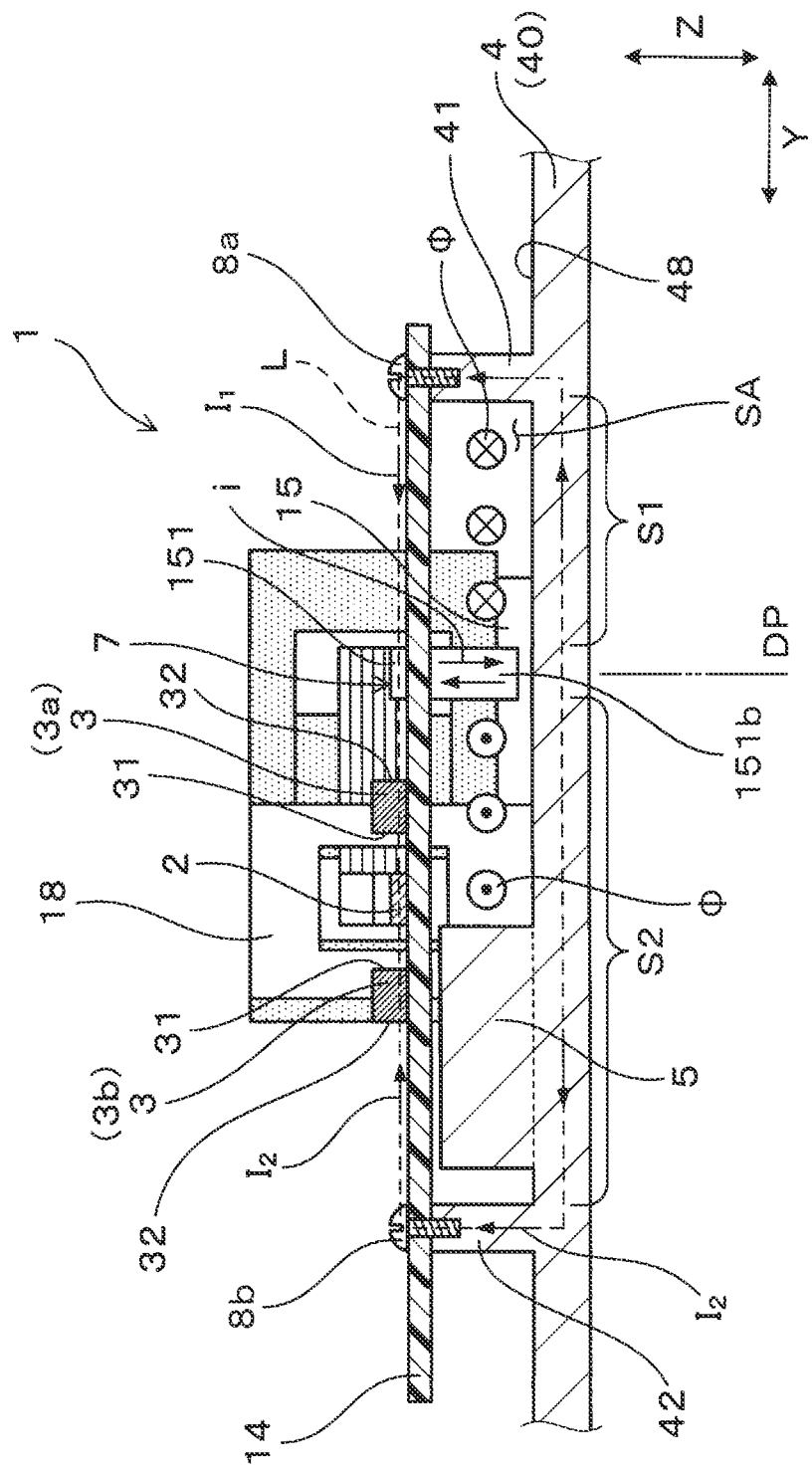
FIG. 3 is a cross sectional view taken on line III-III in FIG. 2.

Referring to FIGS. 1 to 3, the power converter 1 is comprised of a power converter circuit 10, a case, i.e. a housing, 4, external terminals 2 (2a, 2b, and 2c), and a filter circuit 11 comprised of a plurality of, for example two, capacitors 3, i.e. first and second capacitors 3a and 3b.

The case 4 has a substantially rectangular parallelepiped body in which the power converter circuit 10 and the first and second capacitors 3a and 3b are installed. The case 4 is made of, for example, metal, and grounded. The case 4 has a bottom wall 40 and a sidewall assembly 49 vertically mounted on the bottom wall 40.

The external terminals 2 permit the power converter 10 to be electrically connected to external devices. The external terminal 2a is located in the case 4 such that a first end 22 thereof is, for example, penetrated vertically through a first sidewall 49a of the sidewall assembly 49 while being sealed.

In the figures, a Y direction is defined as a direction parallel to the first sidewall 49a and orthogonal to the extending direction of the external terminal 2a. An X direction is defined as a direction parallel to the extending direction of the external terminal 2a and orthogonal to the Y direction. A Z direction is defined as a direction orthogonal to both the X and Y directions, in other words, orthogonal to the bottom wall 49.

The capacitors 3, i.e. the first and second capacitors 3a and 3b, are disposed on a current path between the case 4 and one external terminal, i.e. the external terminal 2a.

Referring to FIGS. 2 and 3, each of the first and second capacitors 3a and 3b has a rectangular plate-like shape, and has, at its first minor side, a first electrode 31 electrically connected to the external terminal 2a. Each of the first and second capacitors 3a and 3b also has, at its second minor side opposite to the first minor side, a second electrode 32 opposite to the first electrode 31; the second electrode 32 is electrically connected to the case 4.

The first and second capacitors 3a and 3b are so located in the case 4 to sandwich the output terminal 2a therebetween. The conductive loop L is arranged between the AC magnetic-field generating portion 7 and the first sidewall 49a.

In addition, the power converter 1 is comprised of a printed-circuit board 14 installed in the case 4. As illustrated in FIG. 1, the printed-circuit board 14 has a substantially L shape when viewed from the top side of the case 4, which is opposite to the bottom side thereof. The printed-circuit board 14 is supported at its short-side portion on two metal columns (first and second columns) 41 and 42 projecting vertically from the inner surface 48 of the bottom wall 40 of the case 4 such that a first surface thereof faces the inner surface 48 (see FIG. 3).

The first and second columns 41 and 42, which are separated from each other, are located close to the first sidewall 49a, so that the short-side portion of the L-shape printed-circuit board 14 is located close to the first sidewall 49a. As illustrated in FIG. 3, a part of the output terminal 2a is mounted on a second surface of the short-side portion of the printed-circuit board 14 opposite to the first surface thereof.

Particularly, referring to FIG. 2, the first electrodes 31 of the respective first and second capacitors 3a and 3b are mounted on the second surface of the short-side portion of the printed-circuit board 14, and also electrically connected to the output terminal 2a via wires 6 formed as a pattern on the second surface of the printed-circuit board 14. The second electrodes 32 of the first and second capacitors 3a and 3b are electrically connected to the first and second ground columns 41 and 42 via wires 6 and bolts 8, i.e. first and second bolts 8a, 8b, respectively. The wires 6 extend lineally in parallel to the Y direction.

Specifically, the first capacitor 3a, the output terminal 2a, and the second capacitor 3b are connected in series between the first column 41 and the second column 42 via the wires 6 to provide a capacitor series circuit SC. Thus, the capacitor series circuit SC, the first and second columns 41 and 42, and the case 4 provide a conductive loop L in which currents flow.

Figure 4:
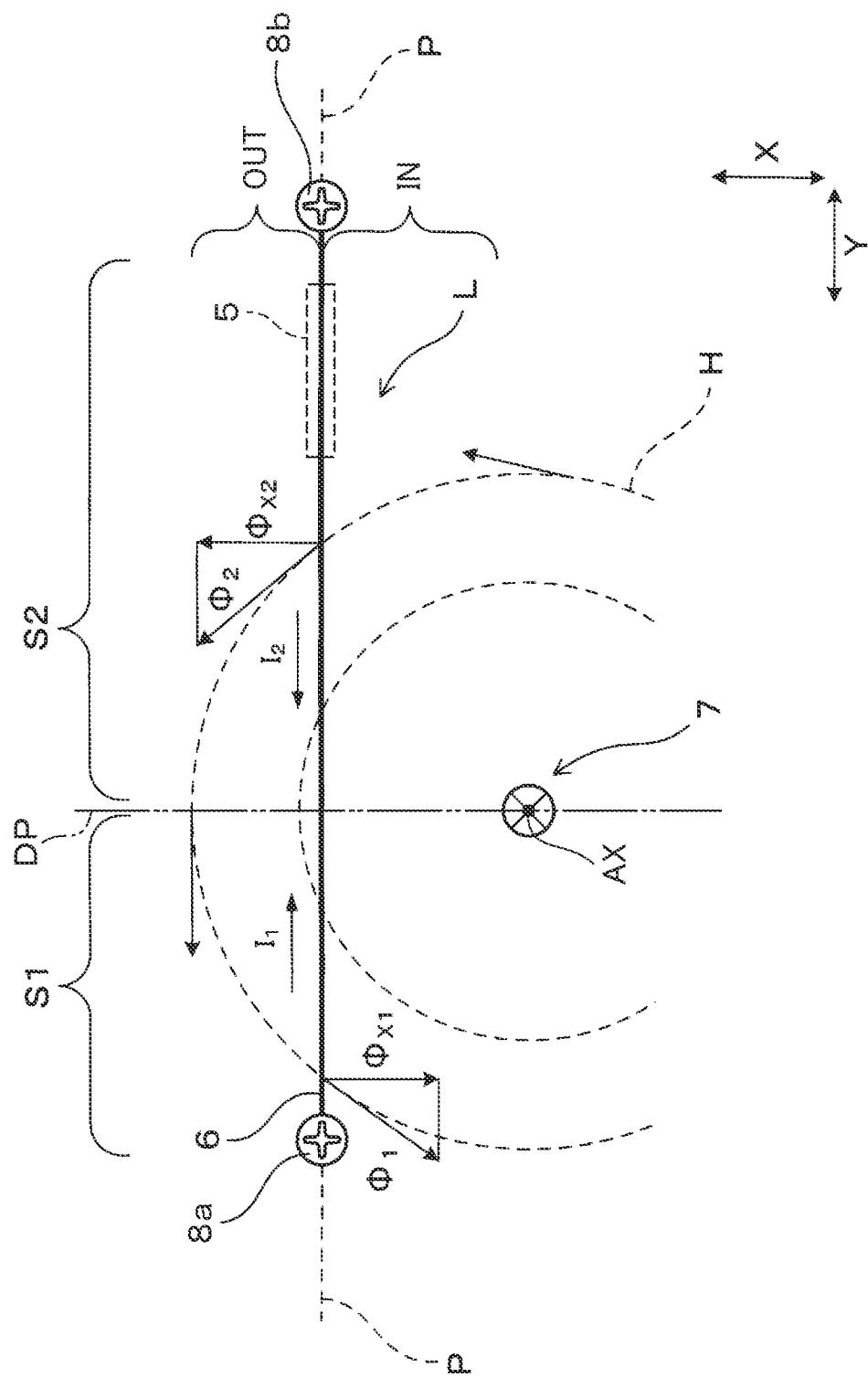
FIG. 4 is a view schematically illustrating a correlation between AC magnetic field and induced noise currents according to the first embodiment.

As illustrated in FIGS. 3 and 4, the conductive loop L has a region SA formed thereinside. The region SA has a first region S1 and a second region S2. A magnetic flux Φ of an alternating magnetic field H is generated by a part of the power converter circuit 10, which serves as an AC magnetic-field generating portion 7.

The power converter 1 is provided with a magnetic-flux shielding member 5 located to partly shied at least one of the first region S1 and the second region S2 from penetration of the magnetic flux Φ. This adjusts the amount of the magnetic flux Φ penetrating from the first region S1 and the amount of the magnetic flux Φ penetrating from the second region S2.

Specifically, in the first embodiment, the magnetic-flux shielding member 5 is configured to shield a part of the second region S2 from penetration of the magnetic flux Φ. In other words, when the area of the region SA formed inside the conductive loop L is defined as a loop area, the magnetic-flux shielding member 5 is operative to reduce the amount of the magnetic flux Φ interlinking with a part of the loop area corresponding to a part of the second region S2.

For example, the magnetic-flux shielding member 5 is located in the second region S2 of the region SA to be adjacent to the second column 42 (see FIG. 3).

In the first embodiment, the magnetic-flux shielding member 5 is made from a metal member. The magnetic-flux shielding-member 5 has a substantially plate like shape, and is located parallel to the first and second columns 41 and 42 such that major surfaces of the magnetic-flux member 5 mask part of the second region S2 of the region SA.

For example, a part of the bottom wall 40 of the case 43, which is located inside the second region S2 of the conductive loop L, is elevated vertically toward the printed-circuit board 14 to have a substantially plate like shape forming the magnetic-flux shielding member 5.

Specifically, the first region S1 is smaller in area than the second region S2. In view of the different in area between the first region S1 and the second region S2, the magnetic-flux shielding member 5 is operative to shield a part of the second region S2 from penetration of the magnetic flux Φ. This causes the area of the first region S1 to be substantially equal to the area of the remaining area of the second region S2 except for the area of one major surface of the magnetic-flux shielding member 5.

This results in reduction of the difference between the amount of the magnetic flux Φ penetrating through the first region S1 and the amount of the magnetic flux Φ penetrating through the second region S2.

Figure 9:
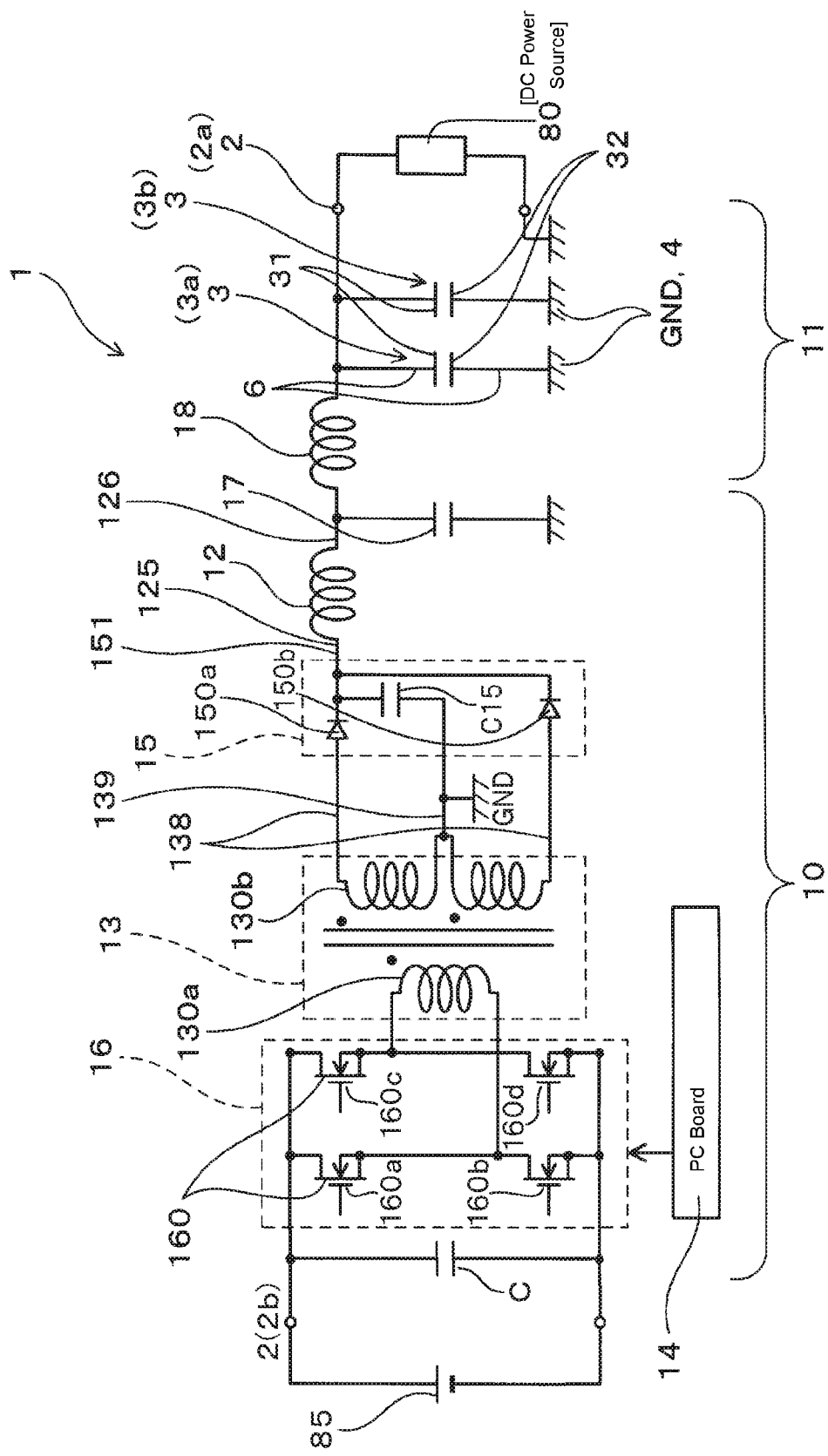
FIG. 9 is a circuit diagram schematically illustrating an example of the structure of a power converter circuit illustrated in FIG. 1.

As illustrated in FIG. 9, the power converter circuit 10 serves as, for example, a step-down converter for stepping down a DC voltage of a high-voltage DC power source 85, and for supplying the stepped-down DC voltage to a low-voltage DC power source 80, thus charging it.

Referring to FIG. 1, as described above, the external terminals 2 of the power converter 1 include the external terminal 2a, referred to as an output terminal 2a, an input terminal 2b, and signal terminals 2c. As described above, the output terminal 2a in the external terminals 2 is electrically connected to the first and second capacitors 3a and 3b to provide the conductive loop L.

As illustrated in FIGS. 1 and 2, the output terminal 2a has a second end 21 opposite to the first end 22. The second end 21 of the output terminal 2a is electrically connected to a choke coil 12; the choke coil 12, which is a part of the power converter circuit 10, is so located on an inner surface 48 of the bottom wall 40 as to face the first sidewall 49a.

The power converter 1 is further comprised of a filter coil 18 around part of the output terminal 2a; the part of the output terminal 2a is located between the second end 21 and the first sidewall 49a. For example, the filter coil 18 consists of a filter core 180 made of a soft-magnetic material, and is located to surround the part of the output terminal 2a. The filter coil 18 faces the first and second capacitors 3a and 3b; these filter coil 18 and the first and second capacitors 3a and 3b provide the filter circuit 11. The filter circuit 11 is operative to eliminate, i.e. remove, transferred noise currents generated in the power converter circuit 10 to thereby prevent the transferred noise currents from entering the output terminal 2a.

Referring to FIG. 2, the magnetic-field generating portion 7 that generates the AC magnetic field H is located close to the filter circuit 11. In addition, the magnetic-field generating portion 7 is located to be closer to the first bolt 8a than to the second bolt 8b.

In the first embodiment, the power converter circuit 10 is comprised of a diode module 15 having an output terminal 151 connected to the choke coil 12, and the output terminal 151 of the diode module 15 serves as the magnetic-field generating portion 7 to generate the AC magnetic field H.

Figure 6:
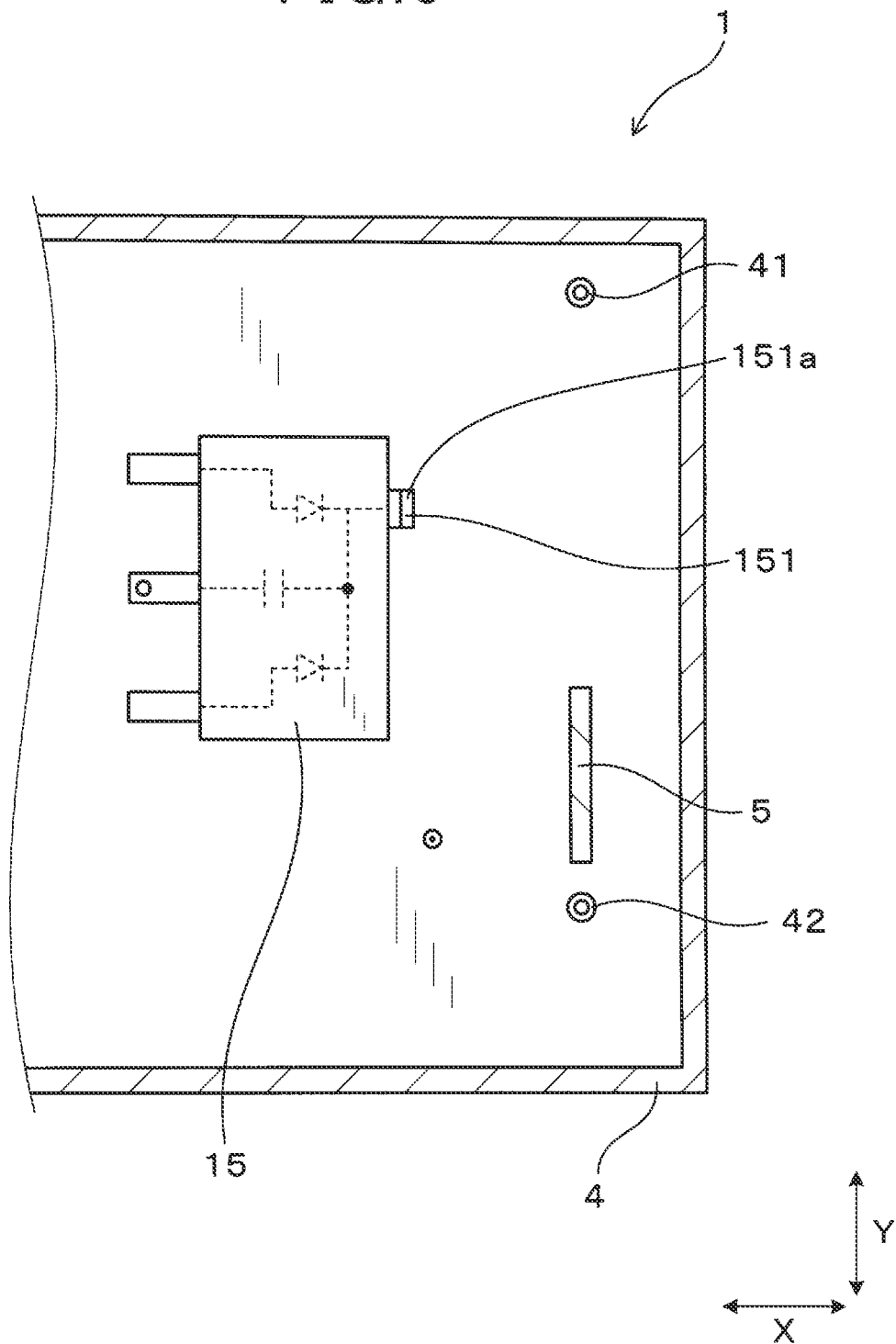
FIG. 6 is a plan view schematically illustrating a case and a diode module illustrated in FIG. 1.
Figure 7:
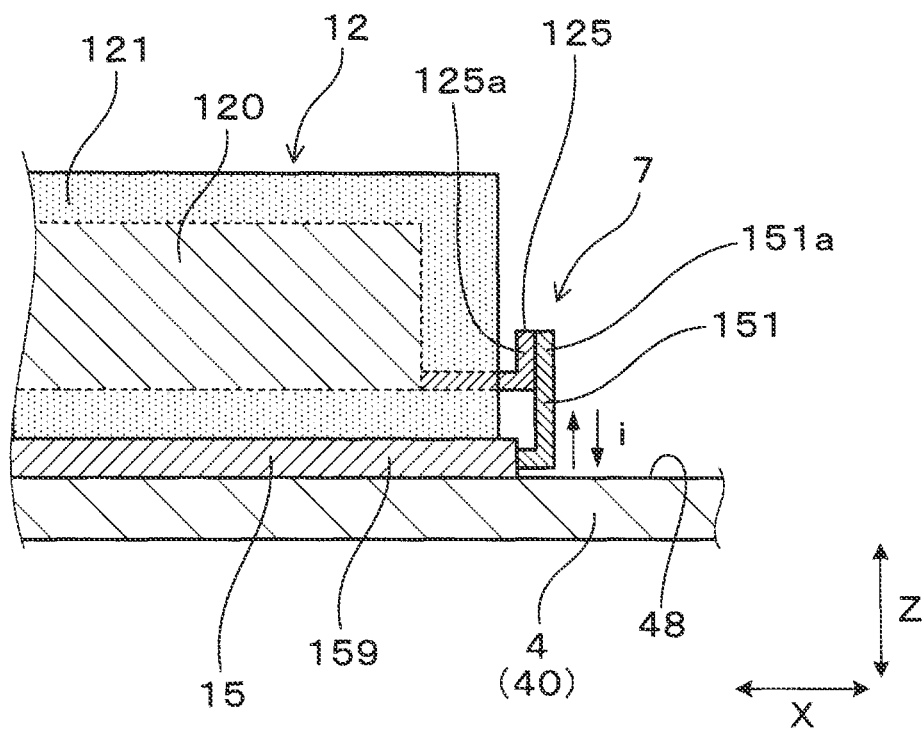
FIG. 7 is a cross sectional view taken on line VII-VII in FIG. 5.

As illustrated in FIG. 3, the diode module 15 is mounted on the inner surface 48 of the bottom wall 49 of the case 4. As illustrated in FIGS. 6 and 7, the choke coil 12 is mounted on the diode module 15. The output terminal 151 projects from one end of the diode module 15, which faces the first sidewall 49a, in the X direction, and is bent to extend upwardly in the Z direction up to a height close to the printed-circuit board 14 (see FIGS. 6 and 7). Because the output terminal 151 extends in the normal direction of the inner surface 48 of the bottom wall 49, i.e. in the Z direction orthogonal thereto, an alternating current i output from the diode module 15 via the output terminal 151 flows in the normal direction of the inner surface of the bottom wall 49. This causes the AC magnetic field H induced by the alternating current i to have the magnetic flux Φ in the form of cylindrical shapes, in other words, concentric patterns around the alternating current i as its center axis AX (see FIGS. 2 and 3).

In the first embodiment, a phantom plane DP is defined to pass through the center axis AX of the AC magnetic field H and to be perpendicular to the conductive loop L, i.e., a line connecting between the head of the first bolt 8a and that of the second bolt 8b.

At that time, as illustrated in FIG. 3, the region SA formed inside the conductive loop L is divided by the plane DP into the first region S1 and the second region S2. The first region S1 is constructed by the plane DP, the first column 41, the first bolt 8a, the wire 6 connecting the plane DP and the first column 41, and a part of the case 4 connecting the plane DP and the first column 41. The second region S2 is constructed by the plane DP, the second column 42, the second bolt 8b, the wire 6 connecting the plane DP and the second column 42, and a part of the case 4 connecting the plane DP and the second column 42.

As described above, the magnetic-field generating portion 7 is located to be closer to the first bolt 8a than to the second bolt 8b, and therefore, the area of the second region S2 is greater than the area of the first region S1.

As illustrated in FIGS. 3 and 4, the concentric-patterned magnetic flux Φ of the AC magnetic field H penetrates, from a near side IN of the conductive loop L close to the magnetic-field generating portion 7, through the second region S2 of the conductive loop L toward a far side OUT of the conductive loop L far from the magnetic-field generating portion 7 (see the reference character of circled dot in FIG. 3).

In addition, as illustrated in FIGS. 3 and 4, the concentric-patterned magnetic flux Φ of the AC magnetic field H penetrates, from the far side OUT of the conductive loop L, through the first region S1 of the conductive loop L toward the near side IN of the conductive loop L (see the reference character of circled cross, that is, ⊗ in FIG. 3).

For example, at the moment illustrated in FIG. 4, an X-direction component Φx1 of a first part Φ1 of the concentric-patterned magnetic flux Φ, which is penetrating through the first region S1, is directed from the far side OUT to the near side IN. This induces a first inductive noise current I1 flowing through the first column 41 of the first region S1 in the Z direction from the ground (case 4) to the head of the first bolt 8a. The first inductive noise current I1 flows through the capacitor series circuit SC in the direction from the first column 41 toward the second column 42 (see FIG. 3) to prevent the change of the X-direction component Φx1 of the first-part magnetic flux Φ1 from the far side OUT to the near side IN.

Similarly, at the moment illustrated in FIG. 4, an X-direction component Φx2 of a second part Φ2 of the concentric-patterned magnetic flux Φ, which is penetrating through the second region S2, is directed from the near side IN to the far side OUT. This induces a second inductive noise current I2 flowing through the column 42 in the Z direction from the ground (case 4) to the head of the second bolt 8b. The second inductive noise current I2 flows through the capacitor series circuit SC from the second column 42 toward the first column 41 to prevent the change of the X-direction component Φx2 of the second-part magnetic flux Φ2 from the near side IN to the far side OUT.

This results in the first inductive noise current I1 and the second inductive noise current I2 flowing in opposite directions to each other in the conductive loop L. Although the AC magnetic field H alternately changes in direction, the X-direction component Φx1 of the first-part magnetic flux Φ1 and the X-direction component Φx2 of the second-part magnetic flux Φ1 are kept to be oriented in the opposite directions to each other. This causes the first and second inductive noise currents I1 and I2 to flow through the conductive loop L in the opposite direction from each other, resulting in cancellation of the first and second inductive noise currents I1 and I2 from each other.

In the first embodiment, referring to FIG. 2, the wires 6 linearly extend in the Y direction orthogonal to the X and Z directions. The magnetic-field generating portion 7, i.e. the output terminal 151 of the diode module 15, the head of the first bolt 8a, and the head of the second bolt 8b are arranged to define (i) A minimum distance r1 between the magnetic-field generating portion 7 and the first bolt 8a in parallel to the inner surface 48

(ii) A minimum distance r2 between the magnetic-field generating portion 7 and the second bolt 8b in parallel to the inner surface 48 (see two-dot chain lines r1 and r2).

At that time, as described above, because the magnetic-field generating portion 7 is located to be closer to the first bolt 8a than to the second bolt 8b, the minimum distance r1 is shorter than the minimum distance r2.

Figure 13:
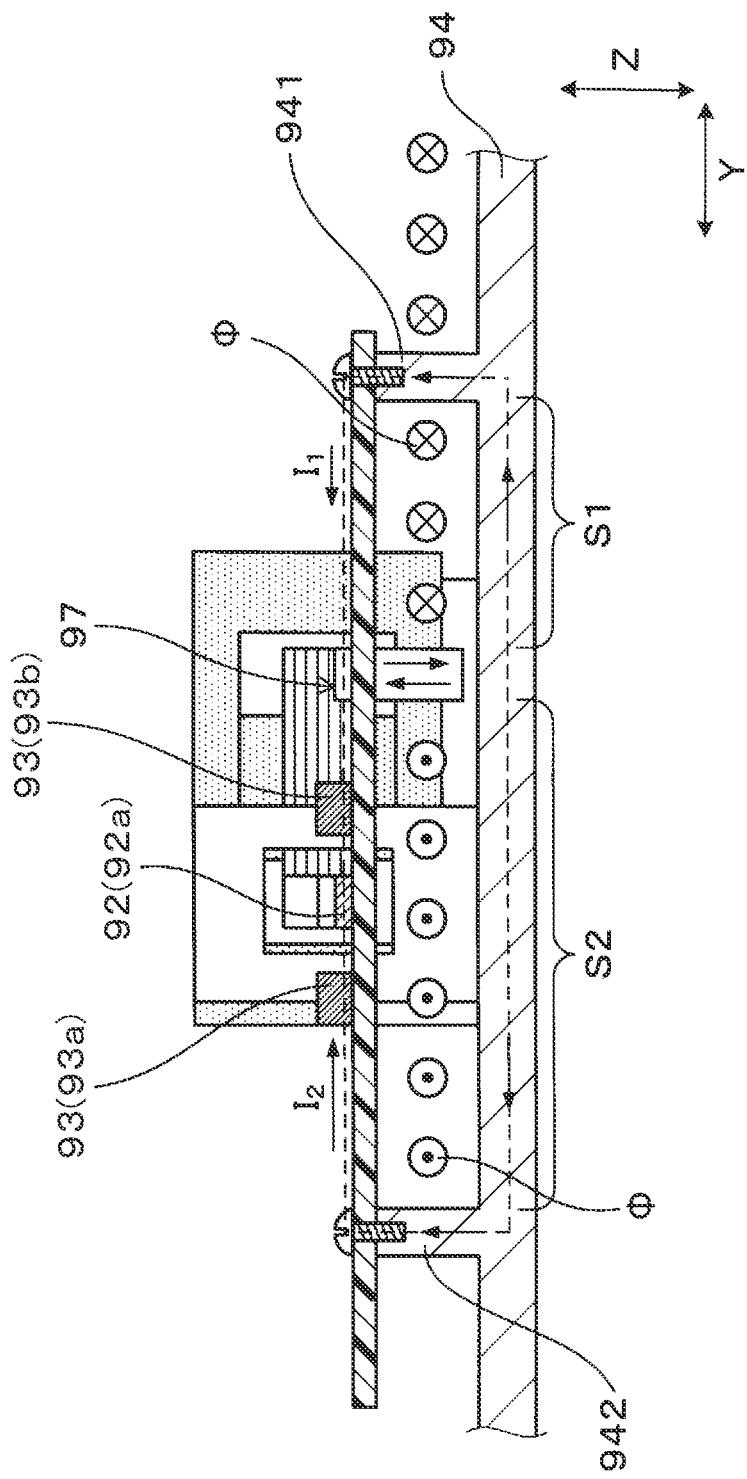
FIG. 13 is a cross sectional view, which corresponds to FIG. 3, of a power converter according to a comparison example of the first embodiment.

If the power converter 1 was not provided with the magnetic-flux shielding member 5, the amount of the magnetic flux Φ penetrating through the second region S2 would be greater than the amount of the magnetic flux Φ penetrating through the first region S1 because the second region S2 is greater in area than the first region S1 (see FIG. 13). Note that, in FIG. 13, reference characters 92 (92a), 93 (93a and 93b), 94, 97, 941, and 942 are respectively assigned to the external terminals 2 (2a), the capacitors 3 (3a and 3b), the case 4, the magnetic-field generating portion 7, the first column 41, and the second column 42 illustrated in FIG. 1.

This would result in the amount of the second inductive noise current I2 flowing through the conductive loop L being larger than the amount of the first inductive noise current I1 flowing through the conductive loop L. For this reason, the first inductive noise current I1 would not completely cancel out the second inductive noise current I2, resulting in inductive noise currents being likely to enter the external terminals 2.

In order to address such a problem, the power converter 1 is provided with the magnetic-flux shielding member 5 located in the second region S2 of the region SA defined inside the conductive loop L.

For example, the magnetic-flux shielding member 5 is located in the second region S2 such that the area of the remaining portion of the second area S2 except for one major surface of the magnetic-flux shielding member 5 is substantially equal to the area of the first region S1. In addition, the remaining portion of the second region S2 except for the magnetic-flux shielding portion 5 and the first region S1 are arranged to be substantially symmetric with respect to the phantom plane DP (see FIG. 4).

The magnetic-flux shielding member 5 shields part of the magnetic flux Φ from penetrating through a part of the second region S2. This results in reduction of the difference between the quantity of the magnetic flux Φ penetrating through the first region S1 and the quantity of the magnetic flux Φ penetrating through the second region S2.

In other words, the magnetic-flux shielding member 5 results in the quantity of the magnetic flux Φ passing through the first region S1, i.e. the number of field lines thereof passing through the first region S1, to be substantially equal to the quantity of the magnetic flux Φ passing through the second region S2, i.e. the number of field lines thereof passing through the second region S2.

This results in the magnitude of the first inductive noise current I1 being substantially equal to that of the second inductive noise current I2, making it difficult for inductive noise currents to enter the external terminals 2.

In the first embodiment, as described above, the magnetic-filed shielding member 5 is formed to be integrated with the case 4. For example, in the first embodiment, the case 4 and the magnetic-flux shielding member 5 are made from aluminum, and is manufactured by die casting. Specifically, the case 4 and the magnetic-flux shielding member 5 are integrally formed by die casting. That is, molten metal, such as aluminum, is forced into a mold cavity created in two dies; the mold cavity is designed to have a shape matching with the case 4 and the magnetic-flux shielding member 5 under high pressure, so that the case 4 and the magnetic-flux shielding member 5 are integrally formed. The area of the magnetic-flux shielding member 5, which masks the loop area of the region SA defined inside the loop L, has a predetermined value is determined to be enough to shield a part of the second region S2 from the pass of the magnetic flux Φ. Similarly, the magnetic-flux shielding member 5 has a predetermined thickness in the X direction; the thickness is determined to be enough to shield a part of the second region S2 from the pass of the magnetic flux Φ.

Referring to FIGS. 1 and 9, the power converter circuit 10 according to the first embodiment is comprised of a MOS module 16, a transformer 13, the diode module 15, the choke coil 12, a smoothing capacitor 17, and the printed-circuit board 14. The printed-circuit board 14 serves as a control circuit for controlling the MOS module 16. The MOS module 16 is connected via a capacitor C to the input terminal 2b, and the input terminal 2b is connected to the high-voltage DC power source 85.

Specifically, as illustrated in FIG. 9, the MOS module 16 is comprised of a first pair of series-connected MOSFETs 160a and 160b, and a second pair of series-connected MOSFETs 160c and 160d, which are configured as an H bridge circuit. One end of the series-connected MOSFETs 160a and 160b is connected to a positive terminal of the high-voltage DC power source 85, and the other end of the series-connected MOSFETs 160a and 160b is connected to a negative terminal of the high-voltage DC power source 85. Similarly, one end of the series-connected MOSFETs 160c and 160d is connected to the positive terminal of the high-voltage DC power source 85, and the other end of the series-connected MOSFETs 160c and 160d is connected to the negative terminal of the high-voltage DC power source 85.

Each of the MOSFETs 160a to 160d has a control terminal connected to the printed-circuit board 14, that is, the control circuit.

In the first embodiment, the control circuit 14 is designed to complementarily turn on the high- and low-side MOSFETs 160a and 160b with high frequency. Similarly, the control circuit 14 is designed to complementarily turn on the high- and low-side MOSFETs 160c and 160d with high frequency. In addition, the control circuit 14 is designed to alternately turn on a first set of high- and low-side MOSFETs 160a and 160d and a second set of high- and low-side MOSFETs 160c and 160b. These operations of the control circuit 14 permit the MOS module 16 to serve as an inverter that converts a DC voltage input to the MOS module 16 from the high-voltage DC power source 85 into an AC voltage, and applies the AC voltage to the transformer 13.

The transformer 13 is comprised of a primary winding 130a and a secondary winding 130b having a center tap 139 and magnetically coupled to the primary winding 130a. A connecting point between the MOSFET 160a and the MOSFET 160b is connected to one end of the primary winding 130a. A connecting point between the MOSFET 160c and the MOSFET 160d is connected to the other end of the primary winding 130a.

The secondary winding 130b has a first end and a second end opposite to the first end. A first output terminal, i.e. a first end, 138 and a second output terminal, i.e. a second end, 138 of the secondary winding 130b are connected to the diode module 15. The center tap 139 of the secondary winding 130b is connected to the case 4 so as to be grounded.

The diode module 15 is comprised of a first diode 150a, a second diode 150b, and a capacitor C15. The first output terminal 138 of the secondary winding 130b is connected to the anode of the first diode 150a, and the second output terminal 138 of the secondary winding 130b is connected to the anode of the second diode 150b.

The center tap 139 divides the secondary winding 130b into a first winding portion and a second winding portion. The turns ratio representing the number of turns of each of the first and second winding portions of the secondary winding 130b to the number of turns of the primary winding 130a is set to a predetermined value.

The transformer 13 is operative to convert the AC voltage applied to the primary winding 130a, in other words, induced through the primary winding 130a, into a different AC voltage induced in the secondary winding 130b while the primary winding 130a is electrically isolated from the secondary winding 130b. The magnitude of the AC voltage induced across the secondary winding 130b is determined based on the turns ratio.

The cathode of the first diode 150a and that of the second diode 150b are commonly connected to an input terminal 125 of the choke coil 12. The capacitor C15 is connected between the cathode of the first diode 150a and the center tap 139. An output terminal 126 of the choke coil 12 is connected to one end of the smoothing capacitor 17 and one end of the filter coil 18. The other end of the smoothing capacitor 17 is connected to the ground (case 4).

Specifically, the first and second diodes 150a and 150b constitute a full-wave rectifier that full-wave rectifies the AC voltage induced across the secondary winding 130b, thus generating a DC voltage. The choke coil 12 and the smoothing capacitor 170 constitute an LC filter configured to smooth the DC voltage rectified by the full-wave rectifier, thus generating a smoothed DC voltage to be input to the filter circuit 11. Note that the capacitor C15 is operative to bypass noise to the ground (case 4).

As described above, the filter circuit 11 according to the first embodiment is comprised of the filter coil 18 and the first and second capacitors 3a and 3b. Specifically, the other end of the filter coil 18 is connected to one end of the first capacitor 3a and one end of the second capacitor 3b, the other end of each of the first and second capacitors 3a and 3b is connected to the ground (case 4). Thus, the smoothed DC voltage output from the smoothing capacitor 17 passes through the filter circuit 11 while being filtered. As described above, the output terminal 2a is connected to the first and second capacitors 3a and 3b, so that the filtered DC voltage is output from the output terminal 2a to be charged into the low-voltage DC power source 80.

Specifically, as described above, because the control circuit 14 is designed to successively turn on or off the MOSFETs 160a to 160d with high frequency, switching-noise currents are generated in the power converter circuit 10. Thus, the filter circuit 11 is operative to remove the switching-noise currents from the smoothed DC voltage output from the smoothing capacitor 17, thus preventing the switching-noise currents from being output from the output terminal 2a.

Figure 5:
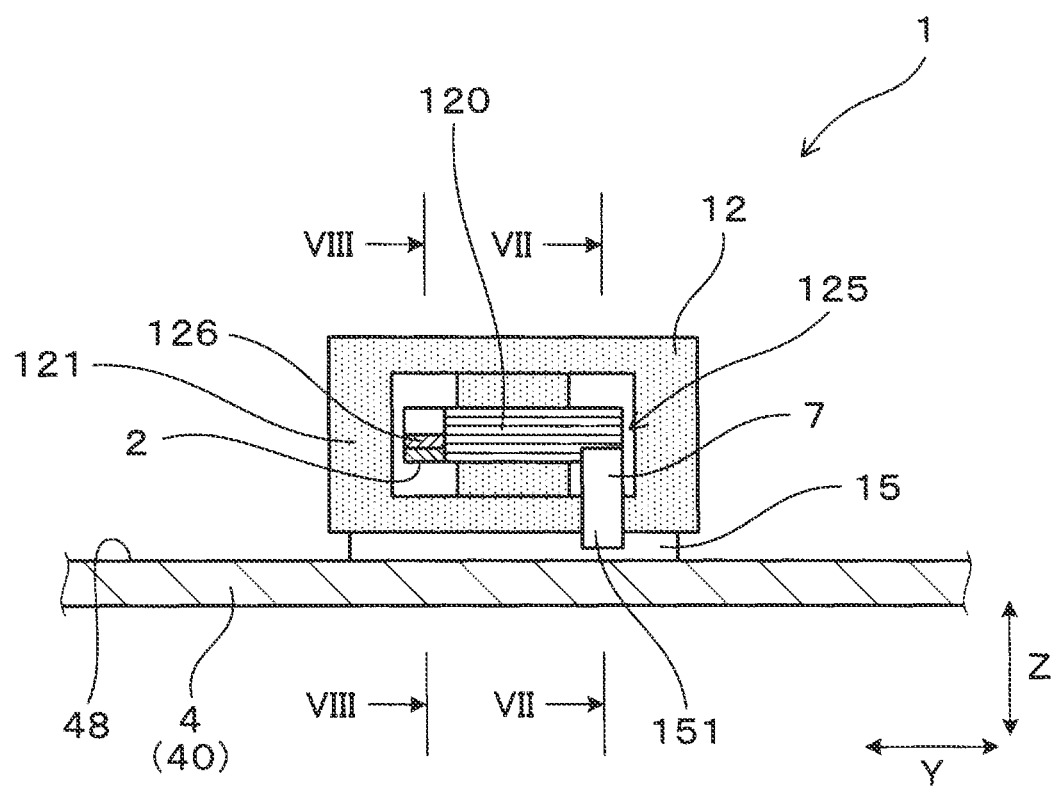
FIG. 5 is a cross sectional view taken on line V-V in FIG. 2.

Referring to FIGS. 5 and 7, the diode module 15 is mounted on the inner surface 48 of the bottom wall 49 of the case 4, and the choke coil 12 is mounted on the diode module 15. As illustrated in FIG. 7, the input terminal 125 of the choke coil 12, which is located to face the output terminal 151 of the diode module 15, projects in the X direction to the output terminal 151. The input terminal 125 of the choke coil 12 is also bent to extend upwardly in the Z direction up to a height close to the tip 151a of the output terminal 151. That is, the tip 125a of the input terminal 125 and the tip 151a of the output terminal 151 are laminated on each other in the X direction, and they are fixedly joined to each other using, for example, welding. This permits the DC voltage rectified by the diode module 15 to be input to the choke coil 12 via the joint portion of the output terminal 151 of the diode module 15 and the input terminal 125 of the choke coil 12.

Figure 8:
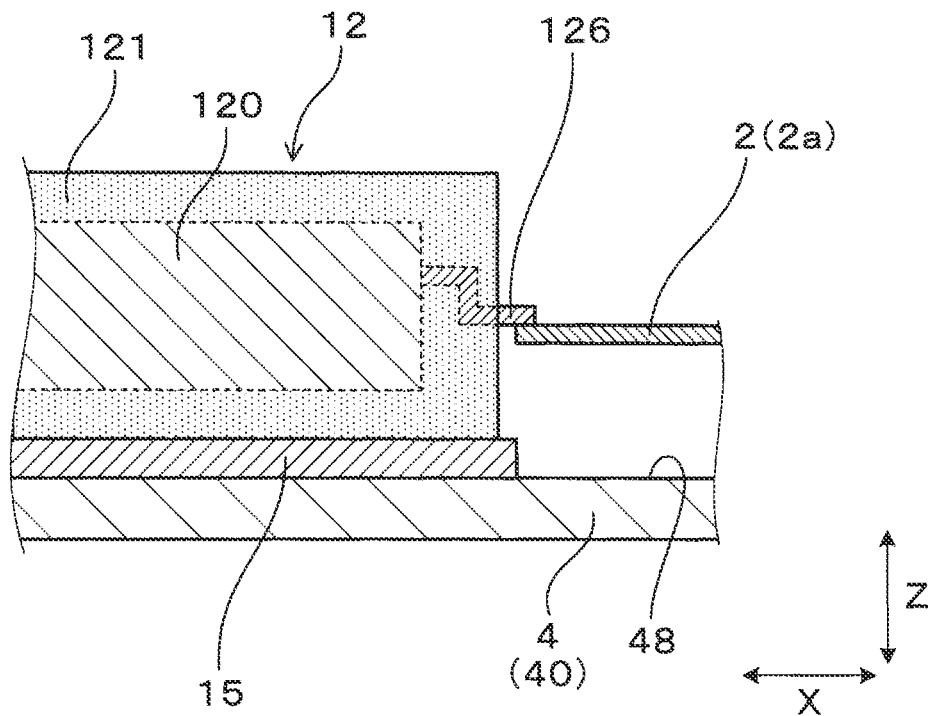
FIG. 8 is a cross sectional view taken on line VIII-VIII in FIG. 5.

In addition, as illustrated in FIGS. 5 and 8, the output terminal 126 of the choke coil 12 extends in the X direction toward the output terminal 2a so that the tip of the output terminal 126 is laminated on the second end 21 of the output terminal 2a. The tip of the output terminal 126 of the choke coil 12 is fixedly joined to the second end 21 of the output terminal 2a by, for example, welding. As illustrated in FIG. 1, one end of the smoothing capacitor 17 is connected to the second end of the output terminal 2a between the choke coil 12 and the filter coil 18, and the other end of the smoothing capacitor 17 is connected to the ground (case 4). This permits the DC voltage smoothed by the choke coil 12 and the smoothing capacitor 17 to be input to the filter circuit 11 via the joint portion of the output terminal 126 of the choke coil 12 and the second end 21 of the output terminal 2a.

Additionally, the input terminal 2b connected to the MOS module 16 is located in the case 4 such that it is penetrated vertically through a second sidewall 49b of the sidewall assembly 49; the second side wall 49b is opposite to the first sidewall 49a. Similarly, the printed-circuit board 14 has a connector 140 projecting from one end portion thereof facing the second sidewall 49b. The connector 140 including the signal terminals 2c is penetrated through the second sidewall 49b in parallel to the input terminal 2b. To the connector 140, any external devices, such as a host controller, can be communicably connected for inputting various instructions to the printed-circuit board 14 for controlling, for example, on-off operations of the MOSFETs 160a to 160d (see FIG. 9).

Next, how the power converter 1 according to the first embodiment works in view of addressing inductive noise currents will be described hereinafter.

As illustrated in FIGS. 2 and 3, the power converter 1 according to the first embodiment is configured such that the capacitor series circuit SC and the case 4 for supporting the capacitor series circuit SC provide the conductive loop L in which currents flow.

The power converter 1 is also configured such that the magnetic-field generating portion 7 is located to face the conductive loop L and configured to generate the AC magnetic field H whose concentric-patterned magnetic flux Φ penetrates through the first region S1 and the second region S2 in the conductive loop L.

The power converter 1 is further configured such that (i) The first part Φ1 of the concentric-patterned magnetic flux Φ penetrating through the first region S1 induces the first inductive noise current I1 flowing through the capacitor series circuit SC (ii) The second part Φ2 of the concentric-patterned magnetic flux Φ penetrating through the second region S2 induces the second inductive noise current I2 flowing through the capacitor series circuit SC opposite in direction to the first inductive noise current I1.

This configuration of the power converter 1 causes the first inductive noise current I1 and the second inductive noise current I2 to cancel each other, resulting in the first and second inductive noise currents I1 and I2 being weakened. This makes it possible to prevent inductive noise currents with high levels from entering the output terminal 2a.

The power converter 1 is provided with the magnetic-flux shielding member 5 located in the second region S2 of the region SA defined inside the conductive loop L. Because the first region S1 is smaller in area then the second region S2, the magnetic-flux shielding member 5 is operative to shield a part of the second region S2 from penetration of the magnetic flux Φ. This results in reduction of the difference between the amount of the magnetic flux Φ penetrating through the first region S1 and the amount of the magnetic flux Φ penetrating through the second region S2.

This causes the magnitude of the first inductive noise current I1 to be substantially equal to that of the second inductive noise current I2, making it possible to efficiently reduce entrance of inductive noise currents to enter the external terminals 2.

If the power converter 1 was not provided with the magnetic-flux shielding member 5, the amount of the magnetic flux Φ penetrating through the second region S2 would be greater than the amount of the magnetic flux Φ penetrating through the first region S1. This is because the second region S2 is greater in area than the first region S1 (see FIG. 3). This would result in the amount of the second inductive noise current I2 flowing through the conductive loop L being larger than the amount of the first inductive noise current I1 flowing through the conductive loop L. For this reason, the first inductive noise current I1 would not completely cancel out the second inductive noise current I2, resulting in inductive noise currents being likely to enter the external terminals 2.

In order to solve such a problem without providing the magnetic-flux shielding member 5, it is necessary to change, for example, the locations of the first and second columns 41 and 42. This would reduce the flexibility of design for the layout of the power converter 1.

In contrast, as described above, the power converter 1 according to the first embodiment is capable of solving such a problem by the magnetic-flux shielding member 5 without the need of changing the locations of the first and second columns 41 and 42. This provides the power converter 1, which has a higher flexibility of design for the layout thereof.

In the first embodiment, the magnetic-flux shielding member 5 is integrated with the case 4. This configuration eliminates the need to provide the magnetic-flux shielding member 5 as a discrete component. This reduces the number of components of the power converter 1, thus reducing the manufacturing cost of the power converter 1 as compared with a power converter provided with the magnetic-flux shielding member 5 designed as a discrete component.

In the power converter 1 according to the first embodiment, the conductive loop L is comprised of the output terminal 2a itself. The output terminal 2a serves as an output terminal of the power converter circuit 10 for outputting the DC voltage to external devices. Thus, there is a strong need for preventing noise currents from entering the output terminal 2a. In addition, the first and second capacitors 3a and 3b serve as the filter circuit 11 for removing switching-noise currents generated in the power converter circuit 10 from the DC voltage as an output of the power converter circuit 10.

In view of the circumstances, in the power converter 1, the capacitor series circuit SC comprised of the first capacitor 3a, the output terminal 2a, and the second capacitor 3b connected in series via the wires 6, the first and second columns 41 and 42, and the case 4 provide the conductive loop L.

With this configuration, the first and second inductive noise currents I1 and I2 flow through the output terminal 2a of the conductive loop L in the opposite directions to each other, so that the first and second noise currents I1 and I2 cancel each other out. Thus, the configuration of the power converter 1 fulfills such a strong need for preventing noise currents from entering the output terminal 2a.

Referring to FIG. 3, the power converter 1 according to the first embodiment is configured such that the output terminal 151 extends in the normal direction of the inner surface 48 of the bottom wall 40 of the case 4. The power converter 1 is also configured such that the first and second columns 41 and 42 projecting vertically from the inner surface 48 of the bottom wall 40 of the case 4 support the capacitor series circuit SC with a space between the capacitor series circuit SC and the bottom wall 40, providing the conductive loop L.

This configuration permits the concentric-patterned magnetic flux Φ to easily generate the first noise current I1 to flow through the first column 41 and the second noise current I2 to flow through the second column 42 in the respective opposite directions to each other. Specifically, as illustrated in FIG. 4, with this configuration, a plane P including therein the conductive loop L faces and is in parallel to the magnetic-field generating portion 7, i.e. the output terminal 151. Thus, the concentric-patterned magnetic flux Φ of the AC magnetic field H around the magnetic-field generating portion 7 easily penetrates through the first region S1 and the second region S2 formed in the conductive loop L. This makes it possible to easily induce the first inductive noise current I1 and the second inductive noise current I2 flowing in the respective opposite directions through the conductive loop L, thus cancelling the first and second induced currents I1 and I2 with each other to thereby weaken them.

In addition, the first and second columns 41 and 42 mounted vertically on the inner surface 48 of the bottom wall 40 of the case 4 provide a part of the conductive loop L. This reduces the size of the conductive loop L in view of the top side of the case 4 in the Z direction (see FIG. 2), thus downsizing the power converter 1.

Referring to FIGS. 2 and 3, the capacitor series circuit SC is comprised of the first capacitor 3a, the output terminal 2a, and the second capacitor 3b connected in series via the wires 6. Using the wires 6 increases the area of the inner space of the conductive loop L. This permits the concentric-patterned magnetic flux Φ of the AC magnetic field H to easily pass through the first region S1 and the second region S2 formed in the conductive loop L. This cancels the first and second induced currents I1 and I2 with each other to thereby weaken them.

Moreover, the power converter 1 according to the first embodiment is configured such that the first and second capacitors 3a and 3b are fixed on the second surface of the printed-circuit board 14. This configuration results in secure mount of the capacitor series circuit SC on the printed-circuit board 14, and in easy electrical connections of the first and second capacitors 3a and 3b to the output terminal 2a and the case 4.

In the power converter 1 according to the first embodiment, the printed-circuit board 14 is supported on the first and second columns 41 and 42 projecting vertically from the inner surface 48 of the bottom wall 40 of the case 4. In addition, the first and second columns 41 and 42 serve as a part of the conductive loop L. Specifically, the first and second columns 41 and 42 are shared as the supporting members for supporting the printed-circuit board 14 and as ground electrodes for constituting the conductive loop L. This configuration simplifies the structure of the power converter 1. Using the first and second columns 41 and 42 fixedly supports the printed-circuit board 14 at a distance from the inner surface 48 of the bottom wall 40 of the case 4. This increases the area of the inner space of the conductive loop L, thus allowing the concentric-patterned magnetic flux Φ of the AC magnetic field H to easily pass through the first region S1 and the second region S2 formed in the conductive loop L.

As described in detail set forth above, the present disclosure provides the power converters 1 each of which prevents large-magnitude noise currents from entering external terminals thereof.

In the first embodiment, the magnetic-flux shielding member 5 is integrated with the case 4, but the first embodiment is not limited thereto.

Figure 10:
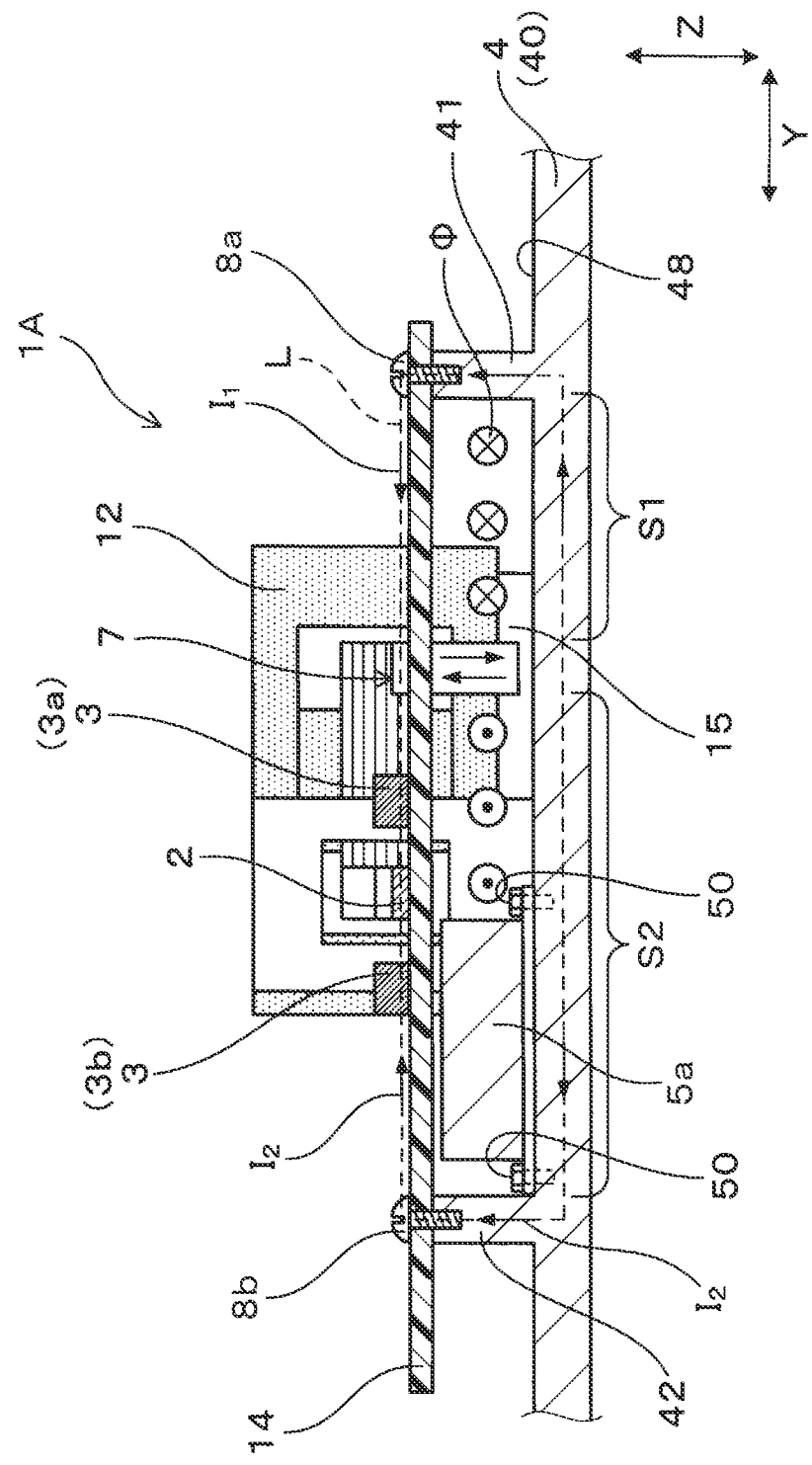
FIG. 10 is a cross sectional view, which corresponds to FIG. 3, of a power converter according to a modification of the first embodiment.

Specifically, as illustrated in FIG. 10, a power converter 1A according to a modification of the first embodiment is provided with a magnetic-flux shielding member 5a located in the second region S2 of the region SA defined inside the conductive loop L and operative to shield a part of the second region S2 from penetration of the magnetic flux Φ. The magnetic-flux shielding-member 5a has a substantially plate like shape, and is located in parallel to the first and second columns 41 and 42 such that major surfaces of the magnetic-flux member 5 mask part of the second region S2 of the region SA. The magnetic-flux shielding member 5a is designed as a discrete component with respect to the case 4, and can be fastened to the case 4 with, for example, bolts 50.

In the first embodiment, the output terminal 2a in the external terminals 2 is electrically connected to the first and second capacitors 3a and 3b to provide the conductive loop L, but the first embodiment is not limited thereto. Specifically, an additional or another conductive loop can be provided for the input terminal 2b in the same configuration as the conductive loop L for the output terminal 2a. Similarly, an additional or another conductive loop can be provided for the signal terminal 2c in the same configuration as the conductive loop L for the output terminal 2a.

In the first embodiment, the case 4 is grounded. This means that the case 4 is connected to the ground having a reference potential, or is connected to another material having a reference potential, such as the body of a vehicle.

Second Embodiment

A power converter 1B according to a second embodiment of the present disclosure will be described hereinafter with reference to FIGS. 11 and 12.

The structure and/or functions of the power converter 1B according to the second embodiment are different from those of the power converter 1 by the following points. So, the different points will be mainly described hereinafter, and therefore, redundant descriptions of like parts between the embodiments, to which like reference characters are assigned, are omitted or simplified.

Figure 11:
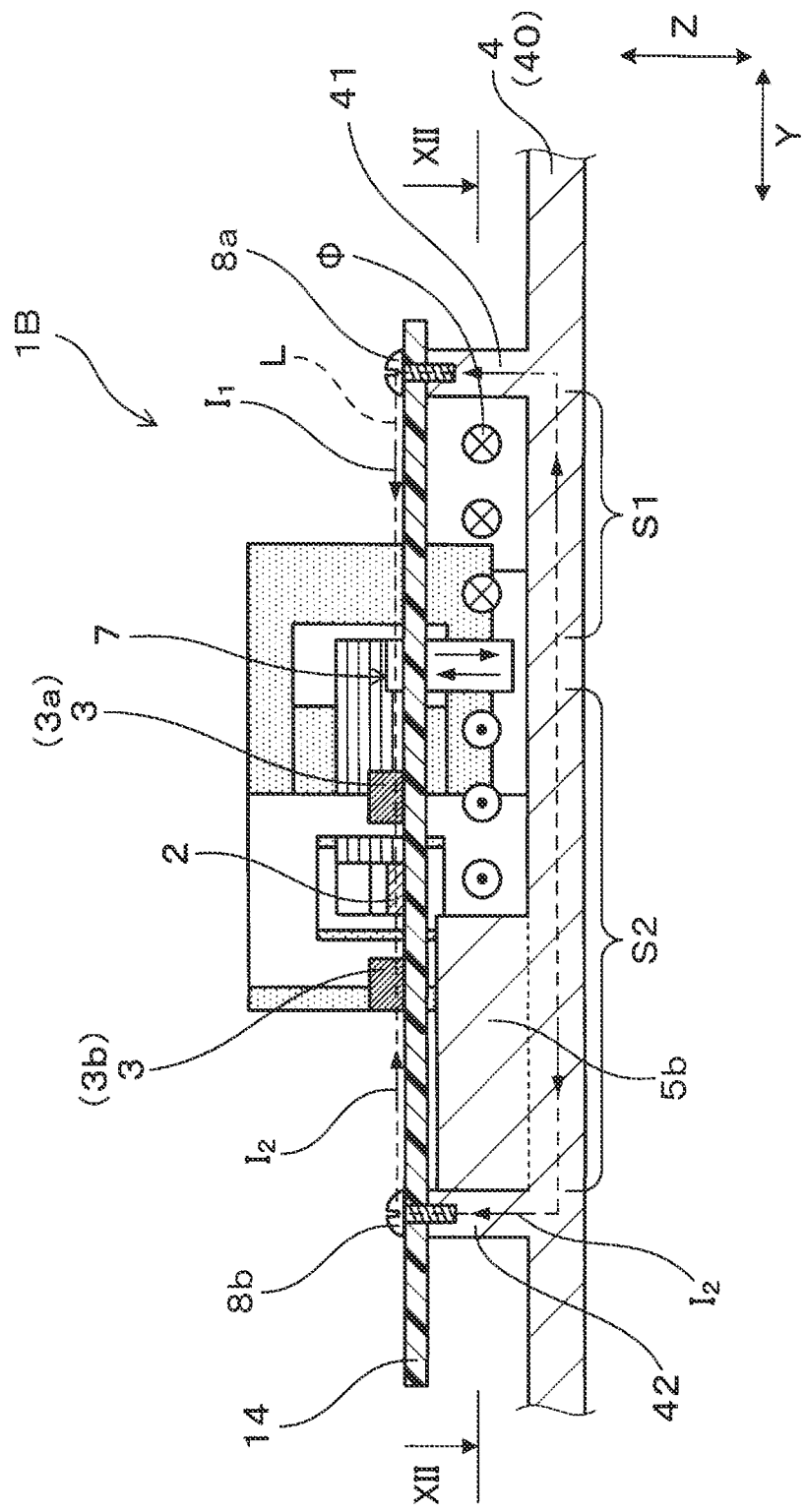
FIG. 11 is a cross sectional view, which corresponds to FIG. 3, of a power converter according to a second embodiment of the present disclosure.
Figure 12:
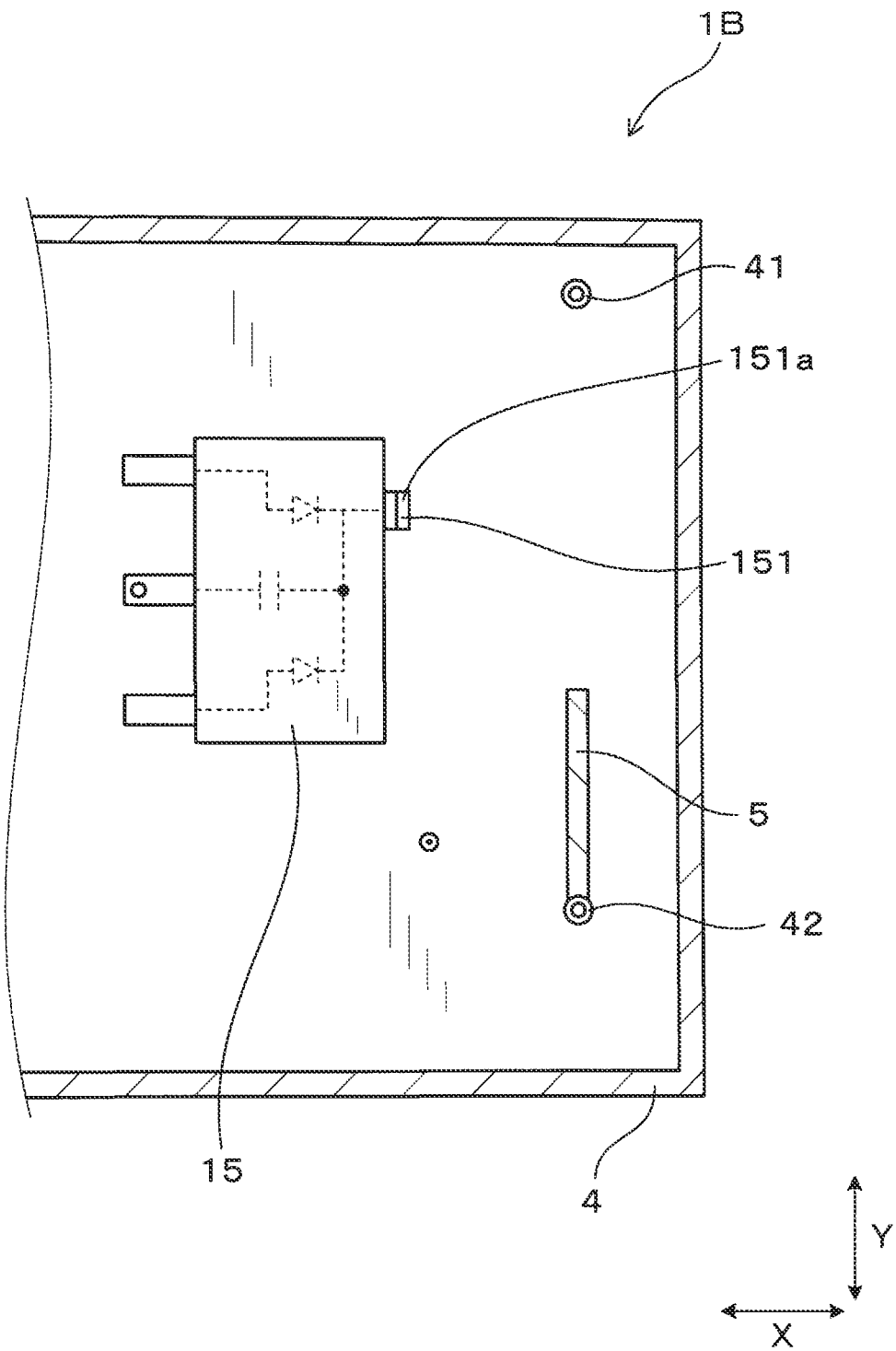
FIG. 12 is a cross sectional view taken on line XII-XII in FIG. 11.

Referring to FIGS. 11 and 12, the power converter 1B according to the second embodiment is provided with a magnetic-flux shielding member 5b located in the second region S2 of the region SA defined inside the conductive loop L and operative to shield a part of the second region S2 from penetration of the magnetic flux Φ. The magnetic-flux shielding member 5b is joined to the second column 42. The magnetic-flux shielding-member 5b has a substantially plate like shape, and is located in parallel to the first and second columns 41 and 42 such that major surfaces of the magnetic-flux member 5 mask part of the second region S2 of the region SA.

Like the first embodiment, the case 4, the first and second columns 41 and 42, and the magnetic-flux shielding member 5b are integrally formed by die casting. That is, molten metal, such as aluminum, is forced into a mold cavity created in two dies; the mold cavity is designed to have a shape matching with the case 4, the first and second columns 41 and 42, and the magnetic-flux shielding member 5b under high pressure. This integrally forms the case 4, the first and second columns 41 and 42, and the magnetic-flux shielding member 5b.

In the second embodiment, during the manufacturing process of the assembly of the case 4, the first and second columns 41 and 42, and the magnetic-flux shielding member 5b, the molten metal easily flows through a part of the mold cavity corresponding to the second column 42 and the magnetic-flux shielding member 5b. This results in the power converter 1B whose assembly of the case 4, the first and second columns 41 and 42, and the magnetic-flux shielding member 5b can be easily manufactured. The other components of the power converter 1B are the same as those of the power converter 1, so that the power converter 1B achieves the same advantages as those achieved by the power converter 1 set forth above.

In each of the first and second embodiments, the magnetic-flux shielding member 5 is operative to shield a part of the second region S2 from penetration of the magnetic flux Φ. This is because the second region S2 is greater in area than the first region S1 in the region SA defined inside the conductive loop L. That is, if the first region S1 is greater in area than the second area S2 in the region SA defined inside the conductive loop L, the magnetic-flux shielding member 5 is operative to shield a part of the first region S1 from penetration of the magnetic flux Φ. This results in reduction of the difference between the amount of the magnetic flux Φ penetrating through the first region S1 and the amount of the magnetic flux Φ penetrating through the second region S2.

Specifically, the magnetic-flux shielding member 5 is capable of partly shielding at least one of the first region S1 and the second region S2 from penetration of the magnetic flux Φ of the AC magnetic field. This adjusts the amount of the magnetic flux Φ penetrating through one of the first region S1 and the second region S2 and the amount of the magnetic flux penetrating through the other thereof.

This adjustment makes it possible to reduce the difference between the amount of the magnetic flux Φ penetrating through one of the first region S1 and the second region S2 and the amount of the magnetic flux penetrating through the other thereof even if there is a difference between the amount of the magnetic flux Φ penetrating through one of the first region S1 and the second region S2 and the amount of the magnetic flux penetrating through the other thereof.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A power converter comprising:
    a power converter circuit having a portion that generates an AC magnetic field having a magnetic flux and configured to perform power conversion of input power into output power;
    a case that is grounded, at least part of the power converter circuit being installed in the case;
    an external terminal electrically connected to the power converter circuit for connection of an external device to the converter circuit;
    a plurality of capacitors located electrically connected to the external terminal and to the case, the external terminal, the case, and the plurality of capacitors being arranged to provide a conductive loop defining thereinside;
    a first region through which the magnetic flux of the AC magnetic field penetrates from one of a first side and a second side of the conductive loop to the other of the first side and the second side of the conductive loop; and
    a second region through which the magnetic flux of the AC magnetic field penetrates from the other of the the first side and the second to the second side to one of the first and the second side of the conductive loop,
    the first side being a near side of the conductive loop closer to the portion of the power converter circuit,
    the second side being a far side of the conductive loop far from the portion of the power converter circuit; and
    a magnetic-flux shielding member configured to partly shield at least one of the first region and the second region from penetration of the magnetic flux of the AC magnetic field to adjust at least one of; and amount of the magnetic flux penetrating through one of the first region and the second region; and an amount of the magnetic flux penetrating through the other thereof, wherein:
    one of the first region and the second region is greater in area than the other thereof; and
    the magnetic-flux shielding member is configured to shield a part of one of the first region and the second region from penetration of the magnetic flux of the AC magnetic field to reduce a difference between the amount of the magnetic flux penetrating through one of the first region and the second region and the amount of the magnetic flux penetrating through the other thereof.

2. The power converter according to claim 1, wherein the portion of the power converter circuit generates the AC magnetic field having concentric-patterned magnetic flux as the magnetic flux around the portion of the power converter circuit, and the first region and the second region of the conductive loop are arranged to face the portion of the power converter circuit while a first flux part of the concentric-patterned magnetic flux penetrates through the first region of the conductive loop and a second flux part thereof penetrates through the second region of the conductive loop to induce a first noise current and a second noise current flowing through the conductive loop in opposite directions to each other.

3. The power converter according to claim 1, wherein the magnetic-flux shielding member is located in the conductive loop.

4. The power converter according to claim 1, wherein the magnetic-flux shielding member is integrated with the case.

5. The power converter according to claim 1, wherein the magnetic-flux shielding member has a substantially plate like shape, and is located such that major surfaces of the magnetic-flux member mask the part of one of the first region and the second region.

6. The power converter according to claim 5, wherein the magnetic-flux shielding member is located such that an area of a remaining portion of one of the first region and the second region except for the magnetic-flux shielding member is substantially equal to an area of the other of the first region and the second region.

7. The power converter according to claim 6, wherein the remaining portion of one of the first region and the second region except for the magnetic-flux shielding portion and the other of the first region and the second region are arranged to be substantially symmetric with respect to a phantom plane, the phantom plane passing through a center axis of the AC magnetic field and being perpendicular to the conductive loop.

8. The power converter according to claim 1, wherein the power converter circuit is mounted on a base surface of the case to be installed therein, the portion of the power converter circuit that generates the AC magnetic field has an alternating-current path arranged in a normal direction of the base surface of the case, so that an alternating current flows through the alternating-current path, the alternating current serving as a source that generates the AC magnetic field, the power converter further comprises:

a pair of first and second conductive columns projecting from the base surface of the case in the normal direction and configured to support the external terminal connected to the first capacitor and the second capacitor, the pair of first and second conductive columns constituting a part of the conductive loop, wherein the magnetic-flux shielding member is located to be adjacent to one of the first and second conductive columns, one of the first and second columns being adjacent to a corresponding one of the first region and the second region.

9. The power converter according to claim 8, wherein the magnetic-flux shielding member is located to be joined to one of the first and second conductive columns, one of the first and second columns being adjacent to a corresponding one of the first region and the second region.

* * * * *